United States Patent [19]

Williamson, III

[11] Patent Number: 5,369,711
[45] Date of Patent: Nov. 29, 1994

[54] AUTOMATIC GAIN CONTROL FOR A HEADSET

[75] Inventor: William A. Williamson, III, Stone Mountain, Ga.

[73] Assignee: BellSouth Corporation, Atlanta, Ga.

[21] Appl. No.: 576,662

[22] Filed: Aug. 31, 1990

[51] Int. Cl.⁵ .............................................. H03G 3/00
[52] U.S. Cl. .................................. 381/104; 381/107
[58] Field of Search ............. 381/72, 104, 106, 107, 381/108; 379/390, 404, 347, 414, 394, 409, 395; 455/242, 235, 381

[56] References Cited

U.S. PATENT DOCUMENTS

| 3,751,602 | 8/1973 | Breeden | 379/390 |
|---|---|---|---|
| 4,079,211 | 3/1978 | Janssen . | |
| 4,224,470 | 9/1980 | Persson et al. . | |
| 4,301,330 | 11/1981 | Trump . | |
| 4,430,754 | 2/1984 | Ishigaki | 381/107 |
| 4,453,258 | 6/1984 | Richardson | 381/107 |
| 4,457,020 | 6/1984 | King | 381/104 |
| 4,538,296 | 8/1985 | Short et al. | 381/72 |
| 4,835,484 | 5/1989 | Coulmance | 379/390 |

FOREIGN PATENT DOCUMENTS 2189953A 11/1987 United Kingdom ................ 381/107

OTHER PUBLICATIONS

J. Lewkowicz & R. L. O'Day Automatic Grain Control with Equalizer Feb. 1979.

Primary Examiner—James L. Dwyer
Assistant Examiner—Jack Chiang
Attorney, Agent, or Firm—Jones & Askew

[57] ABSTRACT

An improved automatic gain control circuit for a telephonic headset having a variable gain stage in the audio signal path, the gain of which is controlled by a control signal appearing across a capacitor. A peak detector is used to detect the presence of peak signals above a predetermined minimum threshold level and a substantially conventional automatic control network is formed around the capacitor in response thereto. During the absence of such peak signals the capacitor is disconnected from the AGC control network and holds the control signal at a constant level. Passage of a predetermined period of time in which no peak signals above the threshold are detected causes a switch to connect a nominal gain setting network to the capacitor to establish a quiescent no signal gain for the circuit which is lower than the maximum gain which the AGC can achieve when it is active.

12 Claims, 2 Drawing Sheets

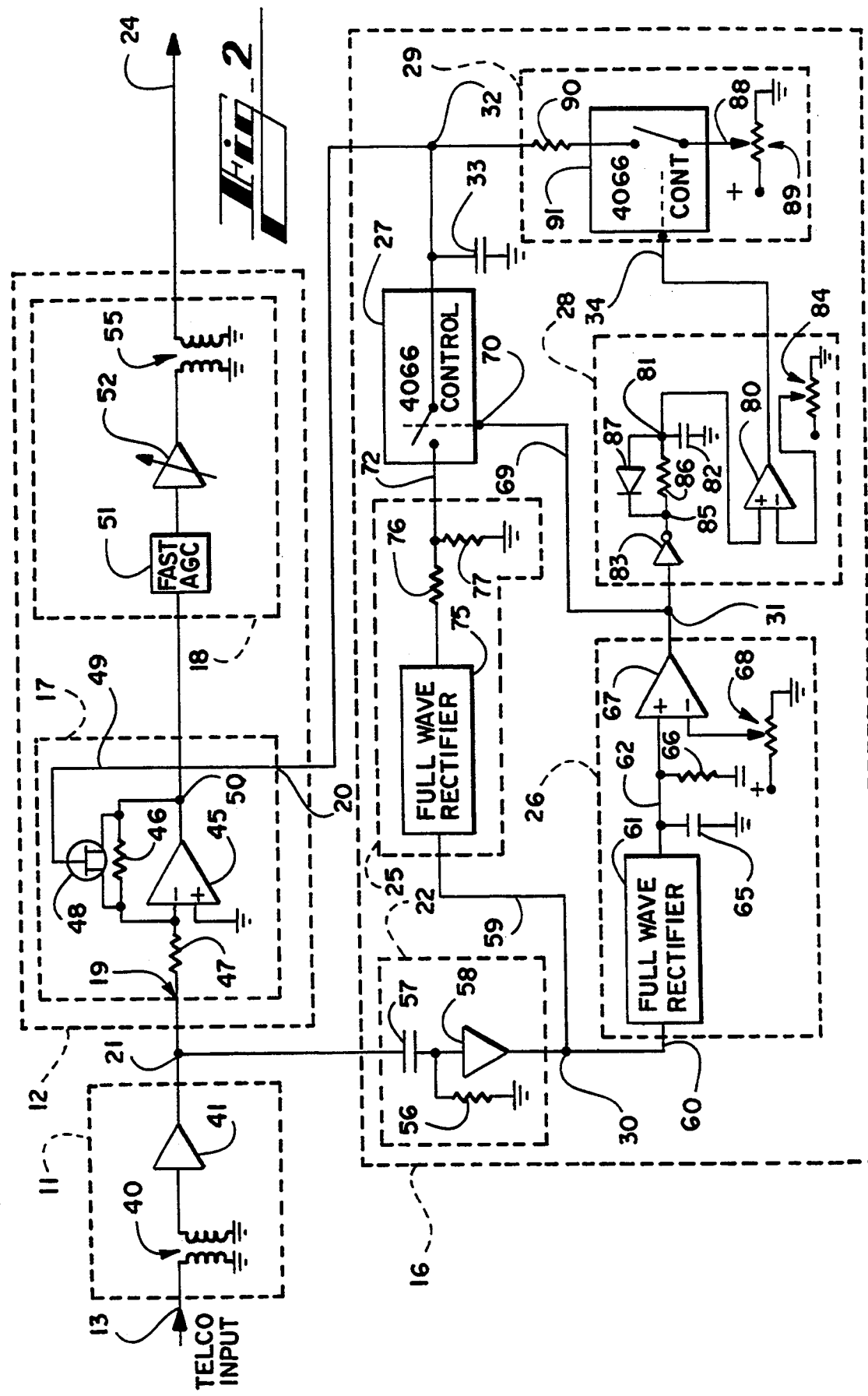

AUTOMATIC GAIN CONTROL FOR A HEADSET

TECHNICAL FIELD

The present invention relates generally to apparatus for automatically varying the gain in an electronic circuit and in particular discloses an improved automatic gain control apparatus for use with a telephone headset, particularly one used in telephonic applications such as automatic call distributor (ACD) or other operator stations.

BACKGROUND OF THE INVENTION

Headsets have long been used in conjunction with modern telephone equipment. Typically, headset users are ones whose jobs require either that they spend a substantial amount of time on the phone, or that their hands be free to perform other tasks. Examples of occupations where headsets are commonly used, include, among others, telephone operators, office receptionists, airline reservation clerks, stock brokers, customer service representatives, and police and fire department dispatchers.

The use of a headset provides many advantages. For example, a headset allows the user to perform other tasks while on the telephone. Examples of such tasks include taking messages, routing incoming calls, and using a computer terminal to enter or retrieve data. The use of a headset also reduces the amount of time required to answer an incoming call, thus making the headset user more efficient. In addition, the use of a headset eliminates the physical discomfort that can occur when a person talking on the telephone attempts to prop a regular telephone handset against his or her ear by tilting the head and raising the shoulder.

However, there are also disadvantages associated with the use of headsets. Since the headset's speaker is held in or against the user's ear, it is impossible to respond to any drastic change in volume by simply moving the speaker closer to, or further away from the ear as one typically does with a regular telephone handset. This is a problem for two reasons. First, incoming calls have different intensity levels, or volumes in common parlance. The volume varies from one call to the next depending on the person speaking, the telephone equipment and other conditions. In addition, there are occasional bursts of noise on the phone line. As those skilled in the art know, many voice signals in telephone calls will be received at a level of approximately $-20$ dBm. Noise bursts on the order of $-10$ dBm or $-5$ dBm are thus 10 to 15 dB higher than the average level for a voice signal.

If a calling party activates the dual tone multi-frequency (DTMF) (touch tone) keypad while his or her telephone station is connected to an operator wearing a headset, a touch tone signal having a level on the order of $-3$ dBm to 0 dBm can be generated on the telephone line at the operator's station.

It is well known that excessive noise causes fatigue and difficulty in concentration on one's work. This is particularly true if one experiences bursts of loud noises. Thus, a reduction in exposure to loud noises is desirable for both the comfort of employees wearing telephonic headsets and to prevent such employees from being unnecessarily fatigued and to meet the requirements of the Occupational Safety and Health Administration (OSHA).

There are existing headset control circuits which address this problem. The first type is a peak limiting circuit which suppresses extremely loud signals. A peak limiting device reduces the level of signals which exceed a predetermined level. The circuit does not increase or decrease the volume of signals which are below that level. As a result, most voice signals pass through the circuit unchanged. Only those signals (voice or noise) which are extremely loud are attenuated by the peak limiter. This type of device prevents the headset user from suffering discomfort or injury which could be caused by excessively loud signals. However, this approach does not bring quiet, low level signals up to a volume level at which they may be clearly and comfortably understood by the headset user. Additionally, most limiting circuits are clipping devices and simply clip off the excursion of a signal past a particular threshold causing odd harmonic distortion which is known to have a harsh sound to the listener.

Conventional automatic gain control (AGC) works in a well known manner to make the gain at a given stage of amplification a function which is inversely proportional to the signal level at a given point in the circuit. Most conventional AGC circuits simply feed back the output of a particular stage to provide a control signal which reduces the gain as the output increases. In most applications of AGC circuits to audio signal paths, the AGC is simply a form of negative feedback and is most commonly used to provide a non-linear (normally approximating logarithmic) signal level to gain characteristic.

It is well known in the art to use such an AGC circuit, together with some form of peak limiting or clipping arrangement, to prevent extremely loud sounds from making it through audio signal paths, particularly signal paths connected to headsets of telephone operators.

As is well known to those skilled in the art, automatic gain control circuits are devices which almost always respond to some form of integrated or average signal level. Those which respond very quickly may be thought of to be devices having very short integration times, and thus are circuits which average a very short time window of the signal level. Slower responding devices make the gain a function of the history of the signal over a longer most recent interval, i.e., they have a longer integration time. Those skilled in the art know that it is common to define and describe two characteristics of automatic gain control circuits known as attack time and release time. The attack time is the time period required after a sudden increase in the input signal amplitude for the gain of the AGC circuit to reach a predetermined percentage of the steady state change in gain it will make in response to continued application of the new input signal level. It may be likened to, and is often the equivalent of, a charging time constant for an R/C circuit. Similarly, release time is defined as a similar interval for the change in amplification which results from a sudden decrease in input signal level. Those skilled in the art know that many AGC circuits are designed so that they have differing attack and release times in order to achieve the desired goals of the AGC circuit without introducing an excessive amount of unpleasant distortion into the audio signal.

Naturally, the goal of AGC circuits is some form of dynamic range compression. Range compression is the act of reducing the difference in signal between the loudest and softest signals present in the signal path. In most applications for audible signals, including those in the art of telephony, it is desirable to have some form of relatively fast attack and slow release characteristics present in the AGC for the following reasons. The relatively fast attack time is desirable so that a loud signal will be attenuated rapidly enough to prevent acoustic shock to a headset wearer. A relatively slow release, usually on the order of one or more orders of magnitude greater than the attack time, is employed to prevent the phenomenon commonly referred to as "pumping" or "breathing". Pumping and breathing in AGC circuits is a phenomenon cause by too rapid a release time such that the listener hears the noise level rise rapidly during the short pauses in the audio signal such as pauses between words or brief quiet passages in music. A rapid increase in the gain due to a fast release time causes the gain to be turned up rapidly when the signal strength drops off, causing a sound (the increase in background noise) which reminds many listeners of a person exhaling. Hence, the expression "breathing".

It is well known to those skilled in the art that automatic gain control can be too successful in a manner which removes so much of the dynamic range of a speech signal that its starts to sound, mushy and distorted, and is difficult to understand.

In a typical voice grade telephone circuit in the public switched telephone network (PSTN) the noise floor for the channel is at a level of approximately −60 dBm. Good voice signals normally have a signal level of −15 to −25 dBm and poor ones will often be on the order of −40 to −50 dBm. Exceptionally good signals can be of a higher level, and DTMF signals on the line will often be on the order of 0 dBm. Therefore, in prior headset AGC circuits for telephone operators, it was prudent to employ peak limiting or clipping circuits, and undesirable to employ a relatively high level of maximum gain to bring the weakest voice signals up to a desired level. This limitation comes from the nature of conventional negative feedback AGC circuits, and in particular the fact that their quiescent no-signal condition is to be in a state in which the maximum gain is provided. An abrupt initiation of a high level signal can cause a loud transit to be applied to an operator's headphones. While a clipping circuit will effectively prevent the signal level from being damaging to the ear, it significantly distorts the signal and, as noted above, introduces distortion which adds to user fatigue.

Therefore, there is a need in the art for an improved automatic gain control circuit for headsets which provides a clear, comfortably audible signal over a rapidly changing range of input levels while eliminating both the "pumped" sound and any excessively loud signals. Additionally, there is a need for an AGC circuit for use with telephonic headphones which is forced to a quiescent state of a gain less than the maximum gain obtained from the AGC amplifier after a significant period of time is passed since the last audio signal above a predetermined noise threshold was applied to the circuit.

SUMMARY OF THE INVENTION

The present invention provides an improved automatic gain control circuit for a headset. Generally described, the present invention employs a variable gain stage to equalize both high and low volume levels. Generally, an input stage is provided which receives the input signal. The input stage is connected to an audio circuit which includes a variable gain stage. This variable gain stage has both an audio input and a control input. The audio gain of the variable gain stage is responsive to a gain control signal which is present at the control input.

The present invention overcomes the drawbacks of the prior art by including an improved control circuit which adjusts the gain to a comfortable level while avoiding "pumping," excessively compressed dynamic range, and other forms of distortion. This is achieved primarily by holding the gain level constant during very brief pauses between syllables and words, and by returning the gain to a predetermined intermediate level after the input signal has been absent for a predetermined period of time. In a preferred embodiment of the present invention, the gain returns to the predetermined intermediate level after approximately three to five seconds.

The control portion of the circuit provides the gain control signal which controls the variable gain stage. The control circuit itself includes a filter which provides a buffered voice band signal. The filter is connected to a peak detector which provides a switching signal whenever the level of the input signal exceeds a predetermined threshold value. The switching signal should be active whenever voice input is present. Thus, the threshold value should be higher than the ambient or background noise, but significantly lower than the average voice level.

This switching signal is connected to a switch and to a timer. The timer is then connected to a second switch. Only one of the two switches is closed at any given time. When the input level is above the threshold and the switching signal is active, the first switch is closed and the gain control signal is determined by the average level of the input signal. In this configuration, the circuit is acting in a manner very similar to a conventional AGC circuit. When the input level falls below the threshold and the switching signal is inactive, the first switch opens and the timer begins to run. The level of the gain control signal remains constant while the timer is timing a predetermined interval. If the level of the input signal again exceeds the threshold value before the timer times out, the first switch closes and the timer is reset.

If and when the timer times out, the second switch closes and the gain control signal is forced to a value which corresponds to a predetermined nominal gain value for the variable gain stage. The predetermined nominal gain is preferably at least 10 dB less than the maximum gain of the AGC. The gain control signal remains at the nominal value until such time as the level of the input signal again exceeds the threshold level. At that point, the switching process described above is repeated.

Thus, it is an object of the present invention to provide an improved automatic gain control circuit for a headset.

It is a further object of the present invention to provide an improved AGC circuit which will hold the controlled gain level constant during intersyllabic pauses in speech or during brief pauses between words. Viewed another way, it is an object of the present invention to provide an improved AGC circuit for which the AGC loop is disconnected during such brief pauses which allows the AGC to operate with a faster release time than conventional circuits without creating excessive pumping or breathing.

It is a further object of the present invention to provide an improved AGC circuit particularly suited for applications in the art of telephony which will set the signal level at a headset or earphone transducer to a relatively constant level without excessive dynamic range compression or clipping of high level signals.

It is a further object of the present invention to provide an improved AGC circuit which sets a quiescent no-signal gain to a level less than the maximum gain of the AGC during signal tracking thereby avoiding excessive transients or clipping if the next following signal is relatively strong.

Other objects, features, and advantages of the present invention will become apparent upon reading the following specification, when taken in conjunction with the drawings and the appended claims.

BRIEF DESCRIPTION OF THE DRAWINGS

FIG. 2 is a schematic diagram of the preferred embodiment of the present invention.

DETAILED DESCRIPTION OF THE DISCLOSED EMBODIMENT

Figure 1:
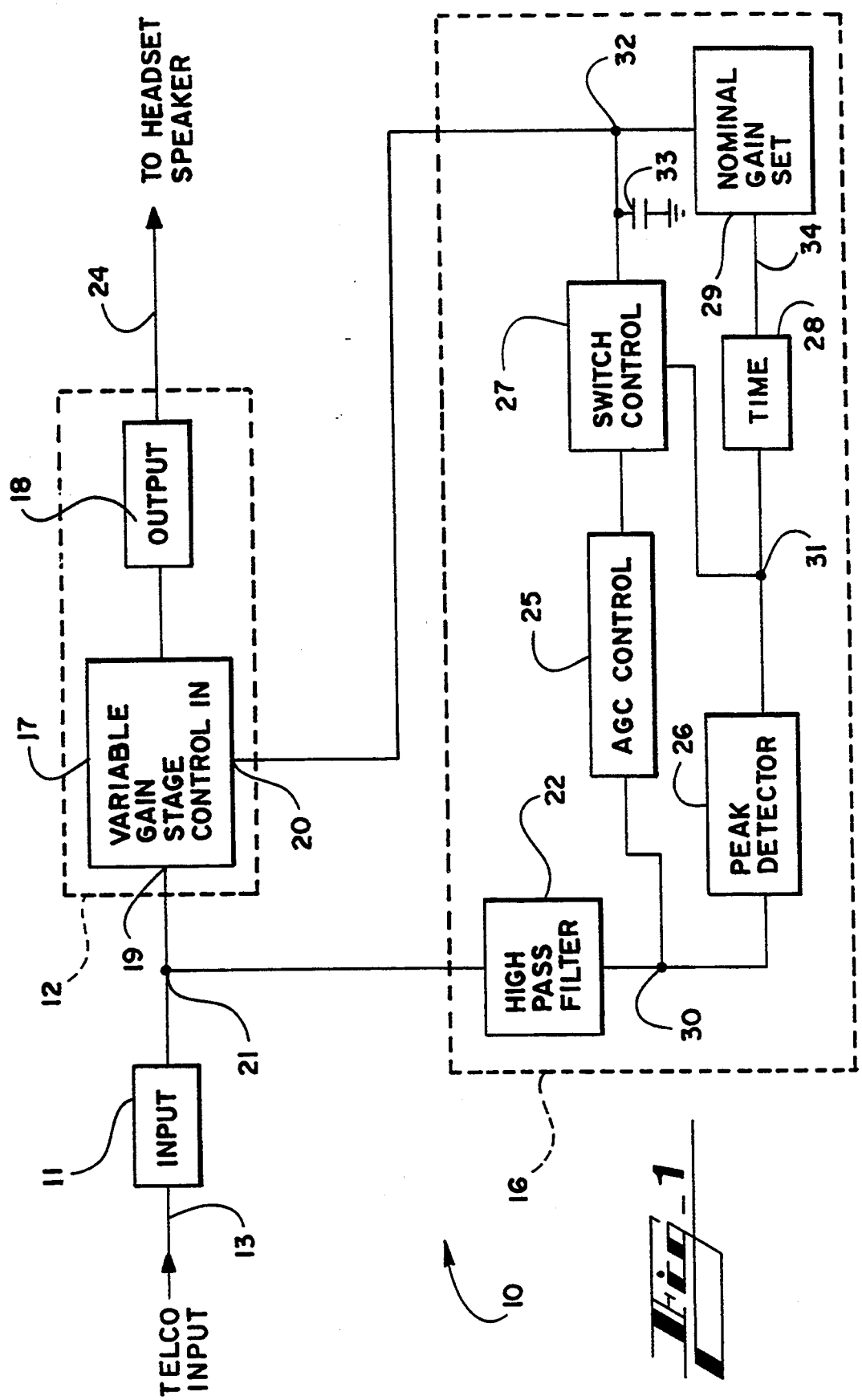
FIG. 1 is a block diagram of the preferred embodiment of the present invention.

Turning next to the drawing figures in which like numerals represent like parts, the preferred embodiment will now be described in detail.

FIG. 1 is a block diagram of the preferred embodiment of the present invention, generally shown at 10, which automatically controls the level of the signal provided at the speaker of a telephone headset. In its preferred embodiment, the present invention includes an input stage 11, an audio stage 12 and a control circuit 16.

The input stage 11 is of conventional design well known to those skilled in the art and will be described only briefly. Generally, the input stage 11 is provided for the purpose of receiving the incoming signals on 13 from the phone system and converting them to a buffered input signal at point 21.

The audio stage 12 is also of conventional design well known to those skilled in the art and will be described only briefly. The audio stage 12 comprises a variable gain stage 17 and an output stage 18. The variable gain stage 17 has two inputs. The first being an audio input 19 and the second being a control input 20. The audio input 19 receives the buffered input signal from point 21. The forward gain of the variable gain stage 17 is responsive to the gain control signal at point 32 which is present at the control input 20. It should be understood that the gain of the variable gain stage 17 may act to amplify or attenuate the buffered input signal at point 21 depending on the specific requirements placed on the apparatus 10. In the preferred embodiment of the present invention the gain of variable gain stage 17 is inversely related to the value of the instantaneous positive voltage at control input 20. The gain control signal 32 is provided by the control circuit 16, which is described below. The output stage 18 is present in order to convert the output of the variable gain stage 17 into an output signal on line 24 which matches the specific characteristics of the output transducer to which the apparatus 10 is attached.

The control circuit 16 provides the gain control signal at point 32 which is the voltage across capacitor 33 and determines the gain of the variable gain stage 17. Generally, the control circuit 16 comprises a filter 22, a peak detector 26, AGC control 25, a switch 27, a timer 28, and a nominal gain setting circuit 29.

High pass filter 22 receives the buffered input signal from point 21 and provides an audio signal to point 30 at its output. The audio signal at point 30 is fed into a peak detector 26, which causes a binary peak signal to be active at point 31 when the signal at point 30 exceeds a predetermined threshold level. Thus, the binary peak signal at 31 is active whenever voice input is present at the input stage 11. It will be appreciated by those skilled in the art that the predetermined threshold level referred to above should be higher than the ambient noise level, but lower than the average voice level. In the preferred embodiment, it is set to be active when a signal level greater than −50 dBm is present at point 30.

Therefore, when peak detector 26 detects a signal above the predetermined threshold it activates switch 27 to connect AGC control 25 to capacitor 33, thus causing AGC control 25 to affect the value of the control voltage at point 32.

Timer 28 is also responsive to the output of peak detector 26 which appears at point 31. It commences timing the passage of a predetermined interval of time each time the signal at point 31 undergoes a high to low transition, indicating that a signal at point 30 which was above the reference voltage for peak detector 26 was previously present and is now gone. When these conditions occur, the output of the timer on line 34 activates nominal gain setting circuit 29 to control the charging of capacitor 33. This establishes a predetermined nominal control voltage at input 20 to variable gain stage 17.

Thus, from FIG. 1 it will be appreciated that the preferred embodiment includes an input stage 11, which feeds signals to the audio signal path through audio stage 12 including variable gain stage 17 and the same signals to control circuit 16. Control circuit 16 acts to control the gain of variable gain stage 17 in response to the buffered input signals at point 21.

It will further be appreciated that the gain control signal at point 32 is, in the preferred embodiment, the voltage across capacitor 33. This voltage is controlled by normal AGC control circuit 25 when signals above a predetermined threshold are detected by peak detector 26. In the absence of signals having peak values above the threshold of detector 26, normal AGC control 25 is disconnected from point 32 through the operation of switch 27. Each time peak detector 26 detects the disappearance of signals above its threshold, timer 28 commences timing a predetermined interval. If the timer succeeds in timing out prior to reestablishment of signals at point 30 above the threshold of detector 26, nominal gain setting circuit 29 is activated and thus controls the voltage across capacitor 33.

It should be noted that, in the preferred embodiment, switch 27 will always be open whenever nominal gain setting circuit 29 is activated.

Turning next to FIG. 2, a schematic diagram of the preferred embodiment is shown. Input stage 11 accepts input from a telephone circuit at 13. It should be noted that this may be any audio signal derived from a telephone network, such as a call switched from an ACD input trunk to a particular operator attendant at a station employing the present invention. An isolation transformer shown at 40 may be needed in particular applications. The principles which govern design of an input stage 11 are well known to those skilled in the art and do not form a part of the present invention, per se. Buffering by an amplifier stage is indicated at 41 in FIG. 2.

The buffered input signal at point 21 is distributed to both audio stage 12 and as the input to control circuit 16. Turning first to path through audio stage 12, the signals at point 21 are connected to input 19 of variable gain stage 17. The variable gain stage in the preferred embodiment is an inverting amplifier constructed around operational amplifier 45, the gain of which is controlled by the ratio of negative feedback resistor 46 to input resistor 47, as is well known to those skilled in the art. Feedback resistor 46 is shunted by field effect transistor 48, the gate of which is connected by line 49 to control input 20. Thus, as the voltage on line 49 increases, the source to drain resistance of field effect transistor 48 decreases, thus shunting feedback resistor 46 and reducing the gain of variable gain stage 17. Those skilled in the art will appreciate that there are many embodiments of a variable gain stage amplifier, the gain of which may be controlled by voltage or current signals, and the type employed in the preferred embodiment is simply one that is familiar to the inventor of the present invention.

The output from variable gain stage 17 appears at point 50 and is provided as an input to output stage 18. Output stage 18 may include a fast automatic gain control circuit as shown at 51 in the drawing figure. Alternately, this may simply be a clipping circuit. In most applications, it is believed that same will not be necessary, but it may be desirable as a measure of extra safety or to prevent transmittal of a very loud transient signal upon the occurrence of an extremely rare noise event in the telephone network.

The remaining elements of output stage 18 are conventional in nature and simply represent a selectively variable gain stage shown at 52 and some form of output coupling, represented by output transformer 55 in the drawing. Variable gain stage 52 represents a user controllable level adjustment which a typical telephone operator using a headset will have at his or her disposal. Naturally, the desirability of an output transformer, or other impedance or level matching device, will be dictated by the type of transducer used in a headset (not shown) connected to output line 24. Thus, it should be understood that the output coupling forms no part of the present invention, per se.

Turning next to the elements of control circuit 16, the first element encountered is high pass filter 22 which is a conventional high pass circuit consisting of resistor 56, capacitor 57, and amplifier 58. The purpose of high pass filter 22 is to provide what this specification refers to as voice band signals at point 30. The values for frequency determining components 56 and 57 are selected so that the −3 dB cutoff point for filter 22 will be in the range of 100 to 200 Hertz. A cutoff frequency in this range assures a good alternating current hum rejection and the filtering of other low frequency noises not likely to be produced by voice signals which have passed through the telephone network.

Thus, it will be appreciated that a voice band audio signal will be present at point 30. From point 30, line 59 connects this signal to the input to AGC control 25, and line 60 connects it to the input to peak detector 26.

Peak detector 26 controls the other apparatus in control circuit 16 to determine the characteristics of the gain control signal at point 32. First, it should be noted that the signal on line 60 is full wave rectified by a conventional full wave rectifier 61 to provide an output on line 62. Line 62 is connected to ground through capacitor 65 and resistor 66 which shunt the input to comparator 67. Comparator 67 is a conventional integrated circuit comparator having a very high input impedance on the order of one or more megohms. Capacitor 65 is charged with the output from full wave rectifier 61. Whenever the signal on line 62 exceeds a threshold value determined by potentiometer 68, the output of comparator 67 at point 31 will go high.

Those skilled in the art will appreciate that it is possible to construct embodiments of peak detector 26 which do not employ resistor 66, the main purpose of which is to provide a discharge path for capacitor 65. Thus, resistor 66 is preferably chosen to be of a high value, but significantly less than the average input resistance expected for the device embodying comparator 67. This prevents radical changes in the RC decay characteristics in the signal at point 62 which might result from a range of input resistances for commercial production runs of integrated circuit comparators.

The values for components 65 and 66 should be chosen to give a discharge time constant on the order of a hundred milliseconds so that it rapidly responds to signals of several hundred Hertz to drive the output of point 31 high and discharge during pauses in speech.

As noted hereinabove, the threshold for peak detector 26 as set by potentiometer 68 should be such so that a signal at line 60, which is provided in response to a −50 dBm signal at telco input 13, will cause peak detector 26 to drive the output of comparator 67 high.

The output at point 31 from peak detector 26 is provided along line 69 to the control input 70 of switch 27 and to point 71 within timer 28. Switch 27 is preferably embodied as one segment of a type CD-4066B quad analog switch of the type manufactured by RCA. Other semiconductor manufacturers make equivalent devices. Those skilled in the art will appreciate that such analog switches are the equivalent of single pole switching devices, as represented by switch 27 in FIG. 2. They have an on resistance of only a few ohms between the input and output, and an off resistance on the order of tens of megohms. The control input is isolated, to the order of several megohms, from the input and output terminals.

Whenever the signal on line 69 goes high switch 27 is closed connecting line 72 to point 32, and thus across capacitor 33. Line 72 is the output of AGC control circuit 25 which simply consists of a second full wave rectifier 75, charge controlling resistor 76, and discharge controlling resistor 77. Whenever line 69 is high, switch 27 is closed and resistors 76 and 77 are connected to capacitor 33. Since this signal path is driven by rectified output from rectifier 75, resistors 76 and 77 control charging and discharging, respectively, of capacitor 33 in response to the magnitude of the voice band signal on line 59. As noted hereinabove, AGC control circuit 25 and capacitor 33 in this configuration constitute a substantially conventional automatic gain control when point 32 is connected to input 20 of variable gain stage 17. It is preferable that this circuit have a fast attack time and a slow release time. Since full wave rectifier 75 will prevent back discharging of capacitor 33 through resistor 76, it will be appreciated that the time constant determined by the values of capacitor 33 and resistor 77 controls the discharge characteristics of the voltage at point 32 when the circuit is in this configuration.

Since it is desired to have a relatively fast attack slow release characteristic, it will be appreciated that resistor 76 is of significantly lower value than resistor 77 and thus resistor 77 will not tend to excessively shunt capacitor 33 during charging. In the preferred embodiment it is preferred that the combination of capacitor 33 and resistor 76 be chosen to give a charging time constant on the order of 0.5 to 3 milliseconds. This allows capacitor 33 to become charged in response to a small number of cycles of either a voice signal on the order of several hundred Hertz, or higher frequency and higher intensity signals produced by operation of DTMF dialing buttons on a telephone set. It is preferred that the value of resistor 77 be chosen to give a discharge characteristic of between 500 and 1,000 milliseconds, i.e., from one half to one second. This allows the control signal at point 33 to track the audio signal relatively rapidly while one is present on line 59.

Consider for a moment what happens when a voice signal on the order of −20 dBm is applied at line 59 and there is a sudden fading by approximately 20 dB. When the signal is first applied to line 59, the relatively low value of resistor 76 allows capacitor 33 to charge rapidly to a value it will maintain during a steady state condition. So long as a signal above the threshold determined by potentiometer 68 in peak detector 26 is present, switch 27 will remain closed and AGC control 25 will determine the voltage across capacitor 33, and thus the value of the control signal applied to variable gain stage at 17. When peak detector 26 provides a low output at point 31, switch 27 opens thus disconnecting capacitor 33 from AGC control circuit 25. It will be appreciated from inspection of FIG. 2 that this leaves capacitor 33 with only high resistance paths to ground and thus the capacitor is essentially unable to discharge in any meaningful manner. Therefore, momentary pauses, such as pauses between words, or intersyllabic pauses which are detected by peak detector 26, will cause switch 27 to disconnect discharging resistor 77 from control capacitor 33 prior to substantial discharging of capacitor 33. Therefore, the control voltage across capacitor 33 will be held until the speech signal once again recommences or one of the other events described hereinbelow takes place.

By this arrangement the present invention will allow the essentially conventional AGC network consisting of AGC control circuit 25 and capacitor 33 to establish the control voltage at point 32 during times in which peak detector 26 is active, and causes the discharge path to be disconnected during pauses so that the circuit does not pump or breathe by increasing the gain in response to short pauses in the speech signal. Since the speech signal will normally recommence after interword or intersyllabic pauses at substantially the same level as it had attained previously, there is very little opportunity for an excessively loud signal to pass through audio signal path 12 prior to a subsequent closing of switch 27 and a reduction in gain due to the rapid charging of capacitor 33 through resistor 76.

From the foregoing description it will be appreciated that a high to low transition at point 31 occurs each time a previously present signal on line 60 above the predetermined threshold for peak detector 26 is removed.

Point 31 also provides the input to timer 28 which is constructed around a comparator 80. The positive input of comparator 80 is taken from point 81 and is thus equal to the voltage across capacitor 82. An inverter 83 provides the logical inverse of the signal on line 31 to point 85. Resistor 86 controls the charging rate of capacitor 82 and diode 87 provides a low resistance discharge path for capacitor 82 back to point 85.

A potentiometer 84 is used to set a threshold reference voltage at the negative input for comparator 80. Those skilled in the art will recognize that the circuit operates as follows. Inverter 83 is chosen to be one of several types available having an active pull down at its output with sufficient current sinking capability to handle the discharge current for capacitor 82. The low on resistance of diode 87 when it is forward biased, and a relatively low output impedance for inverter 83 when driven low with active pull down, provide a very fast discharge path for capacitor 82. When point 31 goes low, which indicates the absence of a binary peak signal, inverter 83 causes point 85 to go high which has the following effect. First, diode 87 becomes back biased and thus need not be considered further. Capacitor 82 begins charging through resistor 86 with a time constant determined by the relative values of these two elements. At the point at which the voltage at point 81 exceeds the voltage established by potentiometer 84, comparator 80 takes its output on line 34 high, thus activating analog switch 91. Switch 91 is a second type 4066 analog switch which is a part of the nominal gain setting circuit 29.

From the foregoing it will be appreciated that even positive signals of very short duration (on the order of microseconds) at point 31 will cause point 85 to go low allowing rapid discharge of capacitor 82. So long as peak detector 26 is detecting voice signals above its threshold, this action will keep capacitor 82 nominally discharged. Note that a constant signal present at point 31 will likewise keep the capacitor discharged thus maintaining a voltage near ground at point 81.

When peak detector 26 fails to detect a voice signal above its threshold for a period of approximately three seconds, capacitor 82 is allowed to charge to a sufficient level to cause the output of inverter 80 to change state, thus activating nominal gain setting circuit 29.

In the preferred embodiment the period for timer 28 is selected to be approximately 3 seconds. Thus, it will be appreciated that the signal at line 34 will make a low to high transition any time a period of approximately 3 seconds since the last time peak detector 26 detected a signal on line 60 above the peak detector's threshold. Therefore, timer 28 is used to detect relatively long periods of no signal being present below the predetermined threshold of approximately −50 dBm. This corresponds to a relatively long absence of any signal which one expects to be a speech signal. When the signal on line 34 makes its low to high transition analog switch 91 closes, thus connecting wiper 88 of potentiometer 89 to point 32 through resistor 90. Potentiometer 89 is selected to provide a predetermined control voltage at its wiper 88. Resistor 90 is selected to control the charging or discharging characteristic of capacitor 33 through this branch when switch 91 is closed.

It should be noted that under the circumstances described, timer 28 assures that a relatively long period of no peaks being detected by peak detector 26 must occur before switch 91 closes. Therefore switch 27 will be open when switch 91 closes since no peak signal will have occurred on line 69 to cause switch 27 to close. Therefore, when switch 91 closes, a period of several seconds (determined by the period of timer 28) will have passed during which capacitor 33 was effectively unable to discharge and was thus holding a value for the control signal at point 32 equal to the last value set during the last time switch 27 was closed. When several seconds of effective silence are detected, switch 91 closes and capacitor 33 is allowed to charge or discharge, depending on the relationship between the control voltage on wiper 88 and the last held voltage on capacitor 33, to a steady state voltage equal to the voltage present at wiper 88.

It should be noted that the resistance value of potentiometer 89 will figure into the equation for the charging/discharging time constant of capacitor 33 when the circuit is in this configuration. Thus, it is preferable to select the value of potentiometer 89 to be relatively low, such as several thousand ohms, so that a value for resistor 90 may be selected which will dominate the charging characteristics. It will also be apparent that judicious selection of the value for potentiometer 89 and the approximate division ratio of same at the wiper may be made so that resistor 90 is not necessary in the circuit.

Under the last described circuit configuration, the setting of potentiometer 89 in nominal gain setting circuit 29 establishes the control voltage at point 32. It should be noted that this occurs, in the preferred embodiment, any time a period of 3 seconds has passed since the last detection of a peak by peak detector 26. Under these conditions, capacitor 33 will not be discharging since switch 27 is open and the gain established by the voltage at point 32 will then move from its most recent value established by AGC control 25 to the nominal gain value established by potentiometer 89.

This arrangement provides several advantages over prior art AGC circuits. First, it allows the overall AGC characteristic to set the quiescent no signal gain value for the audio signal path to a level significantly lower than the maximum gain the AGC circuit can attain. In the preferred embodiment, it is preferable to maintain this nominal gain at a level 10 to 20 dB lower than the maximum gain the AGC can provide when speech signals are present. This avoids the sensation to the listener that all of the "hissing noise" has had the volume turned up under a no signal condition. It also avoids the problem of having the AGC establish a maximum gain through the signal path which can cause an irritating, and possibly damaging, loud transient if the next signal which appears at input 13 is a loud audio signal.

To appreciate this advantage, one only needs to consider a relatively low level voice signal having peak values on the order of −35 to −45 dBm being applied to input 30. From the previous description of the preferred embodiment it will be present that peak detector 26 will be active during the presence of such a voice signal and switch 27 will be closed for all, or a substantial portion of the time that such a signal is present. The action of timer 28 will prevent closure of switch 91 and thus nominal gain setting circuit 29 will not become active under these conditions. Since switch 27 is closed, conventional automatic gain control network 25 will be connected to capacitor 33 and thus determine the control signal at point 32. Under the described conditions, capacitor 33 will be substantially discharged. The lower voltage at point 32 is provided to input 20 and thus lowers the gate voltage on FET 48 tending to turn the transistor off. As the transistor turns off, the shunt is removed from feedback resistor 46 and the gain of variable gain stage 17 increases to a level which will bring this relatively low level voice signal up to a level at which it may be heard through an output transducer (not shown) connected to line 24 without excessive strain on the part of the operator.

When this call is terminated timer 28 will have an opportunity to time out, thus closing switch 91 and causing nominal gain setting circuit 29 to control the voltage at point 32. Thus, under a no signal condition the overall gain of gain stage 20 will be set to a level which, for example, is designed to allow comfortable listening to an audio signal present at input 13 which is at a level of −20 dBm. Since switch 27 is a fast device and resistor 76 is selected to provide a relatively fast attack time as described hereinabove, the attack time for charging capacitor 33 will be very rapid even if a loud signal is applied to input 13. Switch 91 will be released and opened under these circumstances after a delay which is only the propagation delay of the 4066 device itself plus the propagation delays through timer 28, which is dominated by the discharge time for capacitor 82. If however, it is a strong signal which has been applied to the circuit, the signal through lines 59 and 72 will begin charging capacitor 33 as soon as switch 27 closes even though a portion of the current which would otherwise be available for charging will be bled off by resistor 90 until switch 91 opens. Therefore, the circuit responds very rapidly to a high level transient.

The inventor of the present invention believes that the best mode of the present invention is one in which some form of clipping circuit is used for a fast AGC 51 shown in FIG. 2. It is further believed that the best mode of practicing the present invention is one in which most of the components of the AGC are fabricated on an integrated circuit although it is recognized that several of the timing capacitors described herein would need to be external devices. The present inventor does not claim to have the necessary expertise to fabricate, or supervise the fabrication of such a circuit but knows that it is within a level of skill in the art of semiconductor circuit fabrication.

The timing characteristics for charging, discharging, attack, and release characteristics described hereinabove are believed by the inventor to constitute the best mode of the present invention. Complete experimentation has not been carried out as of the date of writing of this specification and it is possible that somewhat different timing characteristics will ultimately prove to be superior to those which are presently contemplated as the best mode by the inventor.

Of the important relationships among the timing characteristics described it should be noted that the discharge characteristic for peak detector 26, as established by capacitor 65 and resistor 66, should be on the order of the periods of intersyllabic pauses which one expects to encounter in normal speech. This allows the charging and discharging of capacitor 33 to be controlled only by the signals present on line 59 in voice band speech signals which have peak values exceeding the threshold of peak detector 26, and not to respond to intersyllabic periods of relative silence. Furthermore, the period of timer 28 should be in excess of the discharge period for peak detector 26 so that the nominal gain setting is only reestablished after a pause which is on the order of, or longer than normal interword pauses during a conversation. Thus, AGC control 25 can be designed with a rapid response time (as it is in the preferred embodiment) without having the AGC inappropriately track the diminution in signal level from interword pauses or pauses in a conversation while the speaker is waiting for a response. The action of switch 27 maintains the gain at a level established by the speech signals during such pauses. As noted hereinabove, it is preferable that the output at point 31 switch to its inactive state when there is a pause in excess of approximately 100 milliseconds in signals on line 60 which are above the predetermined threshold of the peak detector.

Additionally, the inventor believes that the best mode for a discrete circuit embodiment for timer 28 may involve use of a retriggerable monostable multivibrator (i.e., a one shot). So long as the output of the one shot may be maintained in one state both during the presence of the binary peak signal at point 31 and for a predetermined period time after its removal, it will satisfy the requirements for timer 28. However, there are also advantages to using the circuitry of the preferred embodiment, in that discrete integrated comparator circuits often come with multiple comparator devices on a single die, and comparator 67 and 80 could physically be a part of one integrated circuit device.

The particular circuit topology and elements selected to form variable gain stage 17 in the preferred embodiment are in no way critical to operation of the present invention. These are simply circuit elements to accomplish the well known function of construction of an audio frequency variable gain stage which happen to be familiar to the inventor of the present invention and those skilled in the art will appreciate that many equivalent devices and arrangements are possible, and indeed known.

From the foregoing it will be appreciated that the preferred embodiment of the present invention overcomes the drawbacks of the prior art described hereinabove and accomplishes the previously stated objects of the present invention. From the description of the preferred embodiment equivalents of the elements shown therein will suggest themselves to those skilled in the art and way of constructing other embodiments of the present invention will suggest themselves to practitioners of the art. Therefore, the scope of the present invention is to be limited only by the claims below.

What is claimed is:

1. An improved automatic gain control circuit for a headset comprising:
    an input stage for accepting input signals;
    a variable gain stage having an audio input connected to the output of said input stage and having a control input, said variable gain stage being responsive to a gain control signal at said control input to vary its forward gain, said forward gain having a predetermined maximum level; and
    control means having an input connected to the output of said input stage, and an output connected to said control input for providing said gain control signal comprising
    filter means connected to said input stage for providing a voice band input signal;
    peak detector means for providing a peak signal in response to the detection of the peak value of said voice band input signal exceeding a predetermined threshold value;
    first switch means connected to said peak detector means for causing said gain control signal to track the magnitude of said voice band input signal in response to the presence of said peak signal; and
    second switch means connected to said peak detector means for holding said gain control signal at a predetermined normal level less than said maximum level in response to the absence of said peak signal for a predetermined period of time.

2. An improved automatic gain control circuit as recited in claim 1, wherein said gain control signal is a voltage developed across a hold capacitor.

3. An improved automatic gain control circuit as recited in claim 1, wherein said filter means comprises in combination
    a high pass filter; and
    a buffer connected to the output of said high pass filter.

4. An improved automatic gain control circuit as recited in claim 1, wherein said peak detector means comprises
    a full wave rectifier connected to the output of said filter means;
    a filter capacitor connected to the output said full wave rectifier; and
    a comparator circuit.

5. An improved automatic gain control circuit as recited in claim 1, wherein said first switch means comprises in combination
    a full wave rectifier; and
    a resistor network; and
    an electronic switch for connecting said resistor network to said hold capacitor.

6. An improved automatic gain control circuit as recited in claim 5 wherein said variable gain stage includes a negative feedback amplifier having a gain setting impedance element shunted by a variable resistance device.

7. An improved automatic gain control circuit as recited in claim 1, wherein said second switch means comprises in combination
    a timer; and
    an electronic switch for connecting said hold capacitor to a source of a predetermined normal gain voltage in response to the output of said timer means.

8. An improved automatic gain control circuit for a headset comprising:
    an input stage for accepting input signals;
    a variable gain stage having an audio input connected to the output of said input stage and having a control input, said variable gain stage being responsive to a gain control signal at said control input to vary its forward gain, said forward gain having a predetermined maximum level wherein said gain control signal is a voltage developed across a hold capacitor; and
    control means connected to said input stage, having an output connected to said control input for providing said gain control signal comprising
    filter means connected to said input stage for providing a voice band input signal wherein said filter means comprises a high pass filter and a buffer connected to the output of said high pass filter;
    peak detector memos for providing a peak signal in response to the detection of the peak value of said voice band input signal exceeding a predetermined threshold value, wherein said peak detector means comprises a first full wave rectifier connected to the output of said filter means and a comparator circuit;
    first switch means connected to said peak detector means for causing said gain control signal to track the magnitude of said voice band input signal with a fast attack/slow release characteristic in response to the presence of said peak signal, wherein said first switch means comprises a second full wave rectifier, a resistor network, and an electronic switch for connecting said resistor network to said hold capacitor; and second switch means connected to said peak detector means for holding said gain control signal at a predetermined normal level less than said maximum level in response to the absence of said peak signal for a predetermined period of time, wherein said second switch means comprises timer means for detecting passage of said predetermined period of time and an electronic switch for connecting said hold capacitor to a predetermined normal gain voltage in response to the output of said timer means.

9. An improved automatic gain control circuit for a headset comprising:

input means for applying an audio signal to a variable gain amplifier, said variable gain amplifier being responsive to a gain control signal to vary its forward gain, and responsive to said audio signal to provide an output signal;

said variable gain amplifier having a characteristic maximum gain provided in response to a characteristic maximum value of said gain control signal;

control means connected to said input means for providing said gain control signal to said variable gain means, said control means comprising;

peak detector means, responsive to said audio signal being of a magnitude in excess of a predetermined threshold value, for adjusting said gain control signal in response to said audio signal; and timer means for setting said gain control signal to a predetermined gain value less than said characteristic maximum value of said gain control signal in response to said peak detector means detecting an absence of said audio signal being of a magnitude in excess of said predetermined threshold value for a predetermined period of time.

10. An improved automatic gain control circuit for a headset as recited in claim 9 wherein:

said peak detector means holds said gain control signal at a substantially constant level during said absence of said audio signal being of a magnitude in excess of said predetermined threshold value for said predetermined period of time.

11. An improved automatic gain control circuit for a headset comprising:

an input stage for accepting input signals;

a variable gain stage having an audio input connected to the output of said input stage and having a control input, said variable gain stage being responsive to a gain control signal at said control input to vary its forward gain; and control means having an input connected to the output of said input stage, and an output connected to said control input for providing said gain control signal comprising means connected to said input stage for providing a voice band input signal in response to said input signals;

peak detector means for providing a peak signal in response to the detection of the peak value of said voice band input signal exceeding a predetermined threshold value;

first switch means connected to said peak detector means for causing said gain control signal to track the magnitude of said voice band input signal in response to the presence of said peak signal and for holding said gain control signal at a substantially constant level reached during tracking of the magnitude of said voice band input signal in response to an absence of said peak signal; and second switch means connected to said peak detector means for holding said gain control signal at a predetermined normal level corresponding to a predetermined normal gain that is less than a maximum gain of said variable gain stage in response to said absence of said peak signal for a predetermined period of time.

12. An improved automatic gain control circuit for a headset as recited in claim 1 wherein:

said first and second switch means cooperate to hold said gain control signal at a substantially constant level during said absence of said peak signal for a predetermined period of time.

* * * * *